United States Patent
Lin et al.

(10) Patent No.: US 9,567,493 B2
(45) Date of Patent: Feb. 14, 2017

(54) CMP SLURRY SOLUTION FOR HARDENED FLUID MATERIAL

(71) Applicants: Kuo-Yin Lin, Jhubei (TW); Wen-Kuei Liu, Hsinchu (TW); Teng-Chun Tsai, Hsinchu (TW); Shen-Nan Lee, Hsinchu (TW); Kuo-Cheng Lien, Hsinchu (TW); Chang-Sheng Lin, Hsinchu (TW); Yu-Wei Chou, Hsinchu (TW)

(72) Inventors: Kuo-Yin Lin, Jhubei (TW); Wen-Kuei Liu, Hsinchu (TW); Teng-Chun Tsai, Hsinchu (TW); Shen-Nan Lee, Hsinchu (TW); Kuo-Cheng Lien, Hsinchu (TW); Chang-Sheng Lin, Hsinchu (TW); Yu-Wei Chou, Hsinchu (TW)

(73) Assignee: TAIWAN SEMICONDUCTOR MANUFACTURING COMPANY, LTD., Hsin-Chu (TW)

(*) Notice: Subject to any disclaimer, the term of this patent is extended or adjusted under 35 U.S.C. 154(b) by 47 days.

(21) Appl. No.: 14/261,644

(22) Filed: Apr. 25, 2014

(65) Prior Publication Data
US 2015/0307747 A1     Oct. 29, 2015

(51) Int. Cl.
*B44C 1/22* (2006.01)
*C09G 1/18* (2006.01)

(52) U.S. Cl.
CPC .................... *C09G 1/18* (2013.01)

(58) Field of Classification Search
CPC ......... B24D 3/08; B24D 18/00; B24B 53/017; B24B 53/12; C09G 1/18
USPC ........... 216/53; 252/79.1–79.4; 438/689–694
See application file for complete search history.

(56) References Cited

U.S. PATENT DOCUMENTS

| | | | | |
|---|---|---|---|---|
| 6,217,416 | B1* | 4/2001 | Kaufman | C09G 1/02 257/E21.304 |
| 6,251,569 | B1* | 6/2001 | Angelopoulos | G03F 7/038 430/18 |
| 2010/0015806 | A1* | 1/2010 | Fukasawa | B24B 37/044 438/693 |
| 2010/0112728 | A1* | 5/2010 | Korzenski | H01L 21/02079 438/3 |

* cited by examiner

*Primary Examiner* — Nadine Norton
*Assistant Examiner* — Maki Angadi
(74) *Attorney, Agent, or Firm* — Haynes and Boone, LLP

(57) ABSTRACT

A method for performing a Chemical Mechanical Polishing (CMP) process includes applying a CMP slurry solution to a surface of a hardened fluid material on a substrate, the solution comprising an additive to change a bonding structure on the surface of the hardened fluid material. The method further includes polishing the surface of the hardened fluid material with a polishing head.

19 Claims, 6 Drawing Sheets

CMP SLURRY SOLUTION FOR HARDENED FLUID MATERIAL

BACKGROUND

Integrated circuits may be formed using various photolithographic techniques. Such techniques typically include use of a Chemical Mechanical Polishing (CMP) process. The CMP process is typically used to grind down and smooth the surface of a semiconductor substrate. In some cases, the CMP process is used to remove some or all of previously formed layer(s) that are no longer needed. For example, trenches may be formed into a semiconductor substrate. Various other layers of material may be deposited within the trenches. To simplify the deposition process, these layers are deposited on the entire semiconductor substrate, including the trench areas and non-trench areas. To remove the deposited layers from the non-trench areas, the CMP process may be applied to grind away the deposited layers.

The CMP process uses a slurry solution that includes a chemical solution with a specific viscosity that will hold very small particles. The particles are made of a hard material such as silica ($SiO_2$) or alumina ($Al_2O_3$). These particles help grind away and smooth the surface of the substrate. Conventional CMP processes are designed such that the primary mode of grinding is the mechanical aspect, particularly, the particles. The smaller aspect of the process is the chemical process, which involves a chemical reaction to help remove the surface of the substrate. Such CMP processes work well for planarizing harder materials such as the dielectric material of an interlayer dielectric (ILD).

In some cases, it may be desirable to perform a CMP process on a softer material such as a photoresist material or an anti-reflective coating material. Such materials are typically formed by applying the material as a fluid and hardening that fluid through a baking process. But, the CMP process is generally not designed to work effectively on such materials. Particularly, there may be undesired scratching and peeling. Accordingly, it is desirable to have a CMP process that works effectively on softer materials such as hardened fluid materials.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
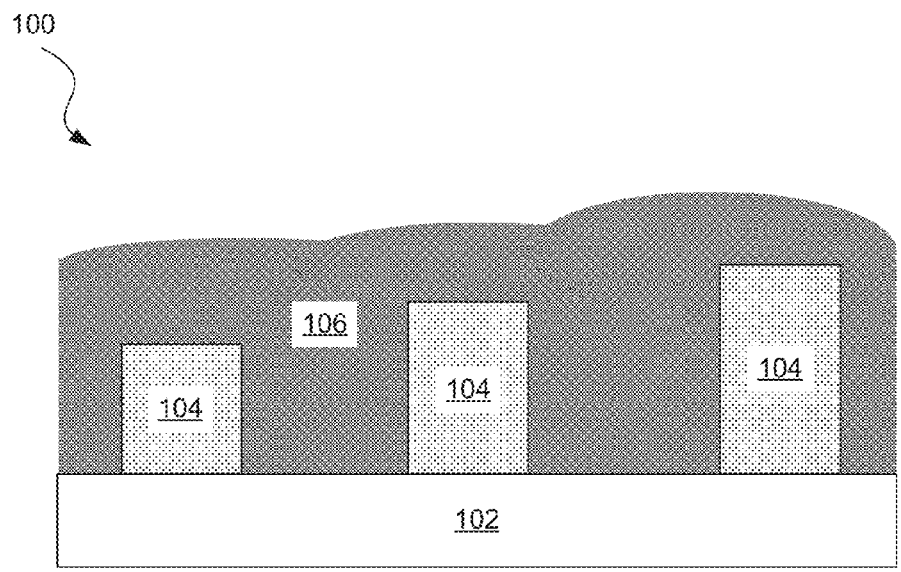
FIGS. 1A-1F are diagrams showing an illustrative fabrication process involving a CMP process on a hardened fluid material, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A-1F are diagrams showing an illustrative fabrication process 100 involving a CMP process on a hardened fluid material. According to the present example, FIG. 1A illustrates a number of integrated circuit features 104 are formed onto a substrate 106. A hardened fluid material 106 is formed over the features 102.

The integrated circuit fabrication process typically includes forming various features 104 onto a substrate 102. These features 104 may include resistors, capacitors, and transistors. Transistors typically include gate structures. Various photolithographic processes may be used to pattern the features 104. The pattern density may vary throughout the pattern. Additionally, different features 104 may be at different heights after the various fabrication processes used to form the features 104 are applied.

In conventional semiconductor fabrication, features 104 formed on a substrate are covered with a dielectric material, often referred to as an interlayer dielectric (ILD). Under application of an electric field, electrons do not flow through a dielectric material like electrons flow through conductors. Thus, the dielectric material is used to isolate conductive features from one layer from conductive features of a different layer.

A CMP process is then formed on the ILD to make it flat for the next layer to be formed on top. A CMP process is used to smooth the surface using both chemical and mechanical forces. A CMP process may involve principles associated with both chemical etching and abrasive polishing. The CMP process involves a slurry solution, which is sometimes referred to as a colloid. The slurry solution has both abrasive and chemical characteristics. Specifically, the slurry solution may include various chemical etchants. Additionally, the slurry solution may include various particles made from a hard material such as silica. The particles act as abrasives during the CMP process.

The CMP process uses a polishing pad that typically has a diameter that is greater than that of the wafer being polished. The wafer is typically secured to a chuck and pressed against the surface of the polishing pad. The chuck is sometimes referred to as the polishing head. The chuck is typically attached to an arm that moves with respect to the polishing pad. Additionally, the polishing head can be rotated. The polishing head may be rotated with different axes of rotation, thus evening out irregular topography and make the surface of the wafer even smoother. A flat and smooth surface is useful when forming additional circuit elements on top of the wafer or for performing various other photolithographic processes. For example, it may be useful to have a flat surface when exposing a photoresist layer because it may be beneficial to bring the entire surface within the depth of field of a photolithography system. Alternatively, when selectively removing material it is important that all the material be of a relatively similar height to begin with. Otherwise, too much, or not enough, material may be removed in a subsequent etching process.

But, because of the size differences and pattern density differences, it is difficult to create a completely flat surface, even with a good CMP process. Moreover, the higher features cannot simply be etched to have a reduced height. Such etching processes may damage the underlying substrate 102.

According to the present example, to resolve this issue, a fluid material, such as a photoresist or Bottom Anti-Reflective Coating (BARC) is applied to cover the feature. The fluid material may be applied through a spin coating process. Spin coating is a process that is used to deposit uniform thin films onto flat surfaces such as the surface of a substrate. Such processes typically involve application of a small amount of coating material to the center of the substrate. The application of the coating material may be done while the substrate is not spinning or spinning at a very low speed. After application of the coating material, the substrate is rotated at a relatively high speed in order to spread the coating material using centrifugal force. A machine used for spin coating may be referred to as a spin coater, or simply a spinner. Rotation of the substrate is continued as the coating material spins off the edges of the substrate until the coating material reaches a desired thickness. In general the higher the angular speed of spinning, the thinner the coating. In some examples, the spin coating process may involve rotation within a range of about 20-80 revolutions per second for a time period ranging between 30-60 seconds. The thickness of the coating may also depend on the viscosity of the coating and other chemical characteristics of the coating.

After the fluid material is applied to cover the feature, a hardening process, such as a baking process, is then used to solidify the fluid material. Thus, the material is referred to as a hardened fluid material 106. The baking process may involve a temperature of about 120 to 180 degrees Celsius.

In some examples, the hardened fluid material 106 is an organic material such as a photoresist material. Because the photoresist material is not being used for photolithographic purposes in this case, it does not have to have a photosensitive component such as a photo acid generator (PAG). The PAG material is used to change the chemical structure of the photoresist under applied light exposure.

In some examples, the hardened fluid material 106 may be an anti-reflective coating (ARC) material. Such material is often used in association with a photoresist to aid the exposure process. Because the ARC material is usually below the photoresist layer, it is sometimes referred to as bottom anti-reflective coating (BARC).

Figure 1B:
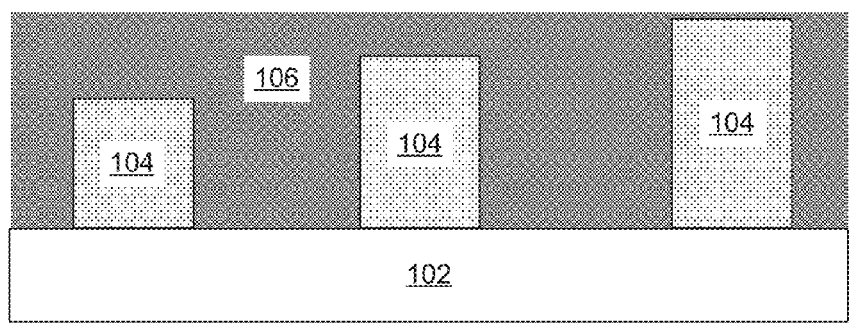

FIG. 1B is a diagram showing an illustrative CMP process 108 performed on top of the hardened fluid material 106. CMP processes are typically designed for harder materials such as an ILD. These processes rely more on the mechanical aspect of polishing and less on the chemical aspect. Because the hardened fluid material 106 is generally a softer material, a standard CMP process may cause scratching and peeling of the surface. This can have adverse effects on subsequent processes.

Accordingly, the CMP process 108 may be tuned for use with a hardened fluid material 106. Such tuning may involve the use of oxidizers and other additives that break down the surface of the hardened fluid material 106 and make it easier to remove and less prone to scratching and peeling. The tuned CMP process will be discussed in further detail below.

Figure 1C:
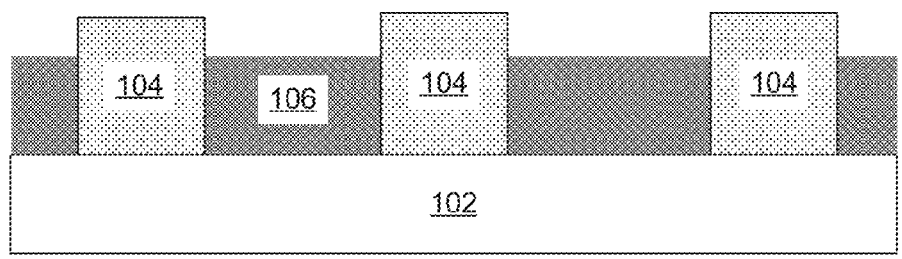

FIG. 1C is a diagram showing an illustrative etching process 110 to reduce the height of some of the features so that they are more even. Etching is a process that is commonly used in integrated circuit fabrication processes. Etching involves the chemical removal of layers from the surface of a substrate. Various types of etching may be done to reduce the height of the features. For example, wet etching and dry etching may be used.

Wet etching involves application of a chemical etchant, which is then agitated to remove material from the surface. The chemical etchant can be designed to perform the etching process in a specific manner. For example, the etching process may be selective. This means that it removes one type of material while leaving other types of material unharmed. In some cases, a selective etch is not perfect. Thus, while it removes one type of material faster than other materials, it may still perform some minor removal of the material intended to remain intact. Thus, while the etching process may be designed to remove material from the features 104, it may unintentionally remove some material from the hardened fluid 106 layer. Another property for which the chemical etchant is designed is isotropy. An isotropic etch will produce rounded sidewalls. An anisotropic etch will produce straight walls. Either type of etching may be used based on the intended purpose.

Because the hardened fluid material 106 is in place, the etching process 110 does not damage the substrate 102. Thus, the etching process 110 can be designed to effectively even the height of the features 104 without concern for damaging the substrate 102. This is important because the substrate 106 may include features that are sensitive to various etching processes. For example, if the features 104 are gate features, then regions of the substrate 102 adjacent the features may be doped to form active regions such as source and drain regions. Moreover, various types of doping processes such as lightly doped drain regions (LDD) may be formed. Such doped regions may be damaged by the etching processes used to reduce the height of features 104.

Figure 1D:
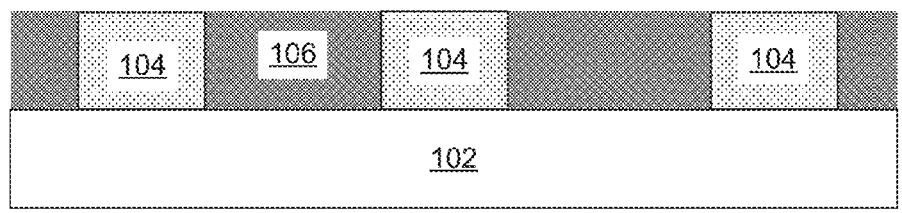

FIG. 1D is a diagram showing an illustrative hard mask removal process 112. In some examples, the top of the features 104 may include remnants of a hard mask material (not shown) used in the patterning process used to form the features. The hard mask removal process 112 thus removes that hard mask material. The hard mask removal process may be performed using etching techniques that are designed to be selective to the hard mask material. Specifically, the etching process may be designed to remove the hard mask material but leave the hardened fluid material 106 relatively unharmed.

Figure 1E:
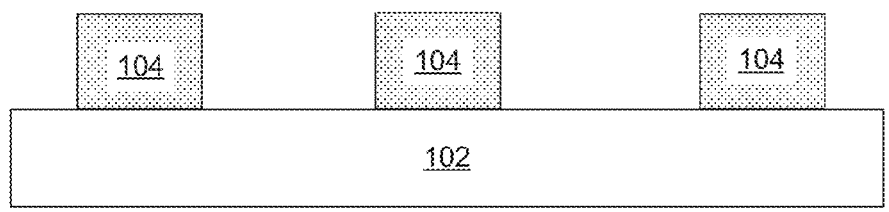

FIG. 1E is a diagram showing an illustrative hardened fluid removal process 114. The hardened fluid material 106 may be used as a temporary layer to protect the substrate. When it is no longer needed, after the etching process is performed, it can be removed. In one example, the hardened fluid material 106 is removed by an ashing process, such as plasma ashing.

Plasma ashing is a process that is commonly used to remove the photoresist material from a wafer after the etching process is complete. The plasma ashing process involves the generation of a monatomic, reactive species using a plasma source. Common reactive species include oxygen or fluorine. Monatomic oxygen plasma is created by exposing oxygen gas at a low pressure ($O_2$) to high power radio waves. This causes ionization of the oxygen. This process is done under a vacuum in order to create the plasma. The reactive species combine with the photoresist to form an ash. The ash can then be removed with a vacuum pump.

Figure 1F:
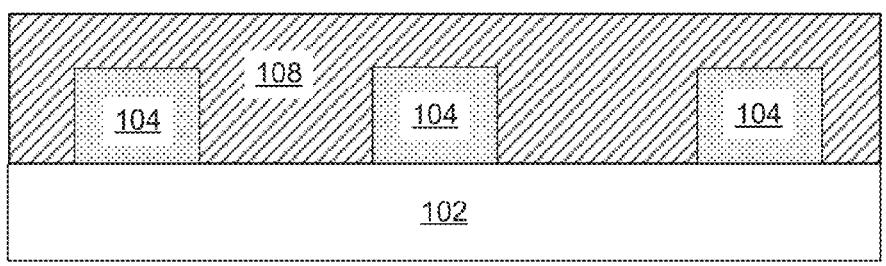

FIG. 1F is a diagram showing an illustrative ILD layer 114. Because the heights of the features 104 are more even in light of the above described process, the ILD layer can be planarized using a standard CMP process and result in a flatter surface. Thus, subsequent layers formed onto the ILD are less affected by non-uniformities in the ILD surface.

Figure 2:
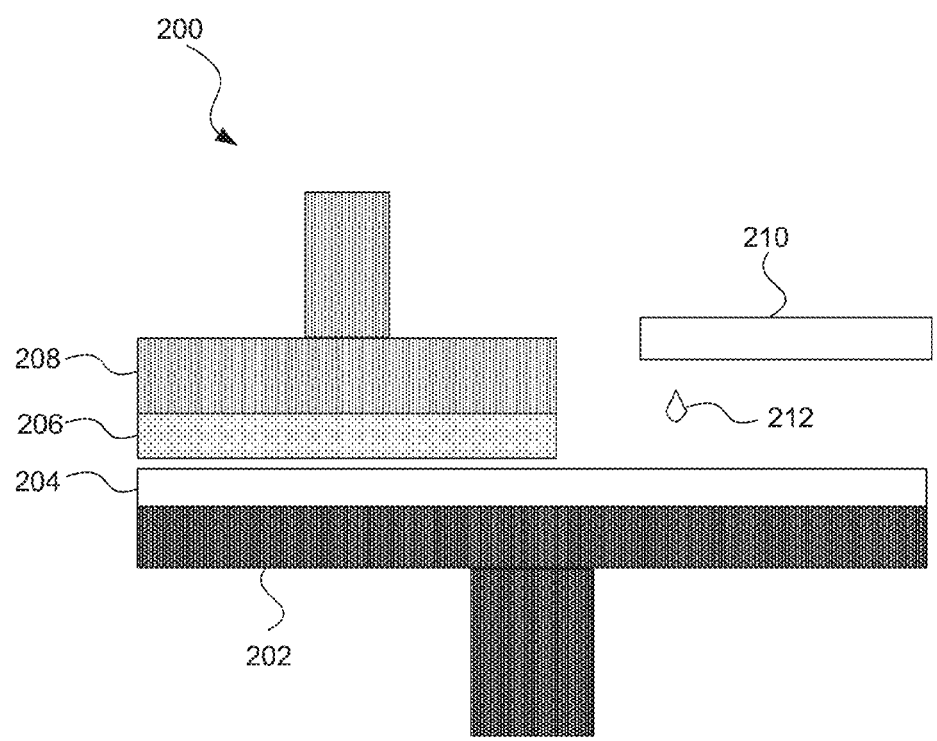
FIG. 2 is a diagram showing an illustrative CMP system, in accordance with some embodiments.

FIG. 2 is a diagram showing an illustrative CMP system 200. According to the present example, the system 200 includes a polishing pad 204 on a platen 202, a wafer 206 secured to a polishing head 208, and a slurry solution delivery tool 210 to deliver a tuned CMP slurry solution 212.

The platen 202 is a very flat structure designed to hold the polishing pad. In some examples, the platen is a circular shape when viewed from the top. Additionally, the platen 202 may be designed to rotate around a central axis. The polishing pad is designed to be pressed directly to the surface of a wafer 206 being polished. The polishing pad 204 provides a very flat surface and is made of a material designed for use with the CMP process.

A semiconductor wafer 206 is typically secured upside down to the polishing head 208. In some examples, a vacuum system is used to secure the wafer 206 to the polishing head 208. The polishing head 208 is thus sometimes referred to as a chuck. The polishing head 208 may include a retaining ring (not shown) to keep the wafer 206 in position and prevent it from moving horizontally with respect to the polishing head 208. The polishing head 208 may be designed to move across the surface of the polishing pad to rub the wafer 206 against the polishing pad 204. In some cases, the polishing head 208 may rotate. The polishing head 208 may also rotate about different axes that are not concentric. This helps produce a smoother surface on the wafer 206 after the CMP process.

The slurry solution tool 210 delivers a slurry solution 212 to the surface of the polishing pad 204. In this example, the slurry solution 212 is tuned for the specific purpose of performing a CMP process on a hardened fluid material (e.g. 106, FIGS. 1A-1F). Thus, the slurry solution 212 has various properties that allow the slurry solution to better planarize the softer hardened fluid surface.

Figure 3:
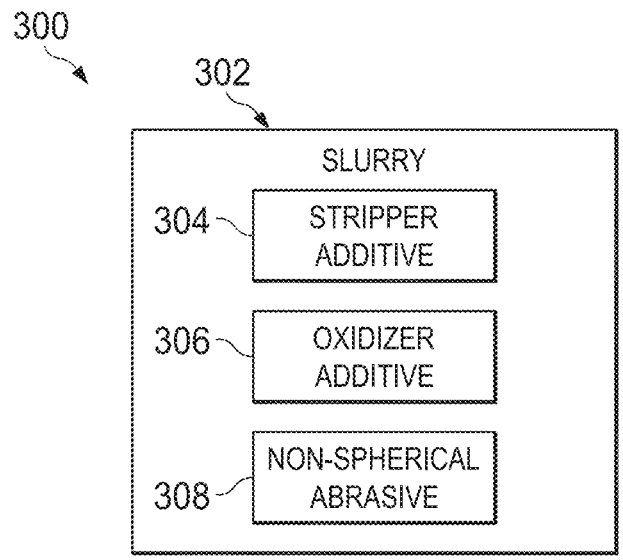
FIG. 3 is a diagram showing illustrative components of a CMP slurry solution, in accordance with some embodiments.

FIG. 3 is a diagram showing illustrative components of a CMP slurry solution 302. According to the present example, the slurry solution 302 includes at least a stripper additive 304, an oxidizer additive 306, and a non-spherical abrasive 308. The slurry solution 302 may include other components as well.

According to one example, the slurry solution may include a stripper additive 304 to help strip the surface of the hardened fluid material. The hardened fluid material is typically an organic material. Thus, the stripper additive 304 can be designed to breakdown organic material. Specifically, the stripper additive 304 can be designed to break the carbon-oxygen bonds or the carbon-carbon bonds of the hardened fluid material.

The stripper additive 304 may include a variety of materials. For example, the stripper additive 304 may include N-methyl-2-pyrrolidone (NMP), dimethyl sulfoxide (DMSO), sulfolane, or dimethylformamide (DMF). Such materials will allow for better surface penetration and dissolution of the hardened fluid material.

The oxidizer additive 306 may also be used to aid and fine tune the CMP process for use with the hardened fluid material. Specifically, the oxidizer additive 306 may be used to help oxidize, soften, and dissolve the surface of the hardened fluid material to reduce friction during the polishing process. Additionally, the oxidizer can inhibit surface stress that can cause peeling.

The oxidizer additive may comprise a number of different materials. For example, the oxidizer may comprise a combination of hydrogen peroxide ($H_2O_2$) and sulfuric acid ($H_2SO_4$). The ratio between hydrogen peroxide and sulfuric acid may be within a range of about 1:1 and 1:10. In some examples, a persulfate compound may be used such as ammonium persulfate ($(NH_4)_2S_2O_8$). Other materials may be used as well. For example, de-ionized water with $O_3$ may be used or peroxymonosulfuric acid ($H_2SO_5$).

The following table shows various other oxidizers that may be used as well as how they react with organic compounds, such as the hardened fluid material.

TABLE 1

| Oxidizer | General Reaction with Organic Compounds |
| --- | --- |
| $H_2O_2$ | $-CH_2- + 3\ H_2O_2 \rightarrow 4\ H_2O + CO_2$ |
| $H_2SO_5$ | $-CH_2- + 3\ H_2SO_5 \rightarrow 3\ H_2SO_4 + CO_2 + H_2O$ |
| $O_3$ | $-CH_2- + 3\ O_3 \rightarrow 3\ O_2 + CO_2 + H_2O$ |
| $S_2O_8$ | $-CH_2- + 3\ S_2O_8 + 2\ H_2O \rightarrow 6\ HSO_4 + CO_2$ |

The slurry solution 302 may also include non-spherical abrasive particles. As described above, a CMP slurry solution is often a viscous solution so that particles can be suspended. The particles are typically spherical in order to provide a smoother surface on the final polished surface. But, because of the softer nature of the hardened fluid surface, the spherical particles are not necessarily beneficial. Thus, non-spherical abrasives may be used. Non-spherical abrasives can increase the mechanical efficiency of the CMP process because they can remove material more efficiently than a spherical abrasive. This is because non-spherical abrasives have rougher edges and sharper corners that can better remove material.

The slurry solution 302 may include a number of other components. For example, the slurry solution 302 may include a wetting agent or surfactant. A wetting agent is a compound that has a molecular structure with both a hydrophobic end and a hydrophilic end. Thus, such materials reduce the surface tension of the slurry solution and provide better contact between the polishing head and the surface of the wafer being polished.

In some examples, the slurry solution 302 may also include an acid catalyst. The acid catalyst may enhance the surface oxidation of the hardened fluid material. Additionally, the acid catalyst may help the hydrolysis reaction that occurs during the CMP process of the hardened fluid material.

In conventional CMP processes, the pH level may be adjusted for various purposes and may range from 2 to 11, for example. In the case of the CMP slurry solution embodying principles described herein, the pH level may be less than seven. Thus, the slurry solution 302 will tend to be a basic solution rather than an acidic solution.

Figure 4:
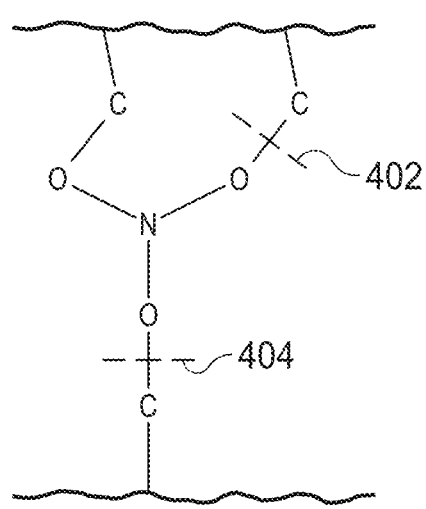
FIG. 4 is a diagram showing an illustrative breaking of chemical bonds, in accordance with some embodiments.

FIG. 4 is a diagram showing an illustrative breaking of carbon-oxygen bonds. FIG. 4 illustrates the chemical bonds of an example hardened fluid. The hardened fluid may include bonds between Carbon (represented by a C), Oxygen (represented by an O), and Nitrogen (represented by an N). FIG. 4 also illustrates breaking 402, 404 of the carbon-oxygen bonds within the hardened fluid material. This helps dissolve or soften the surface of the hardened fluid material and helps with the CMP process.

Figure 5:
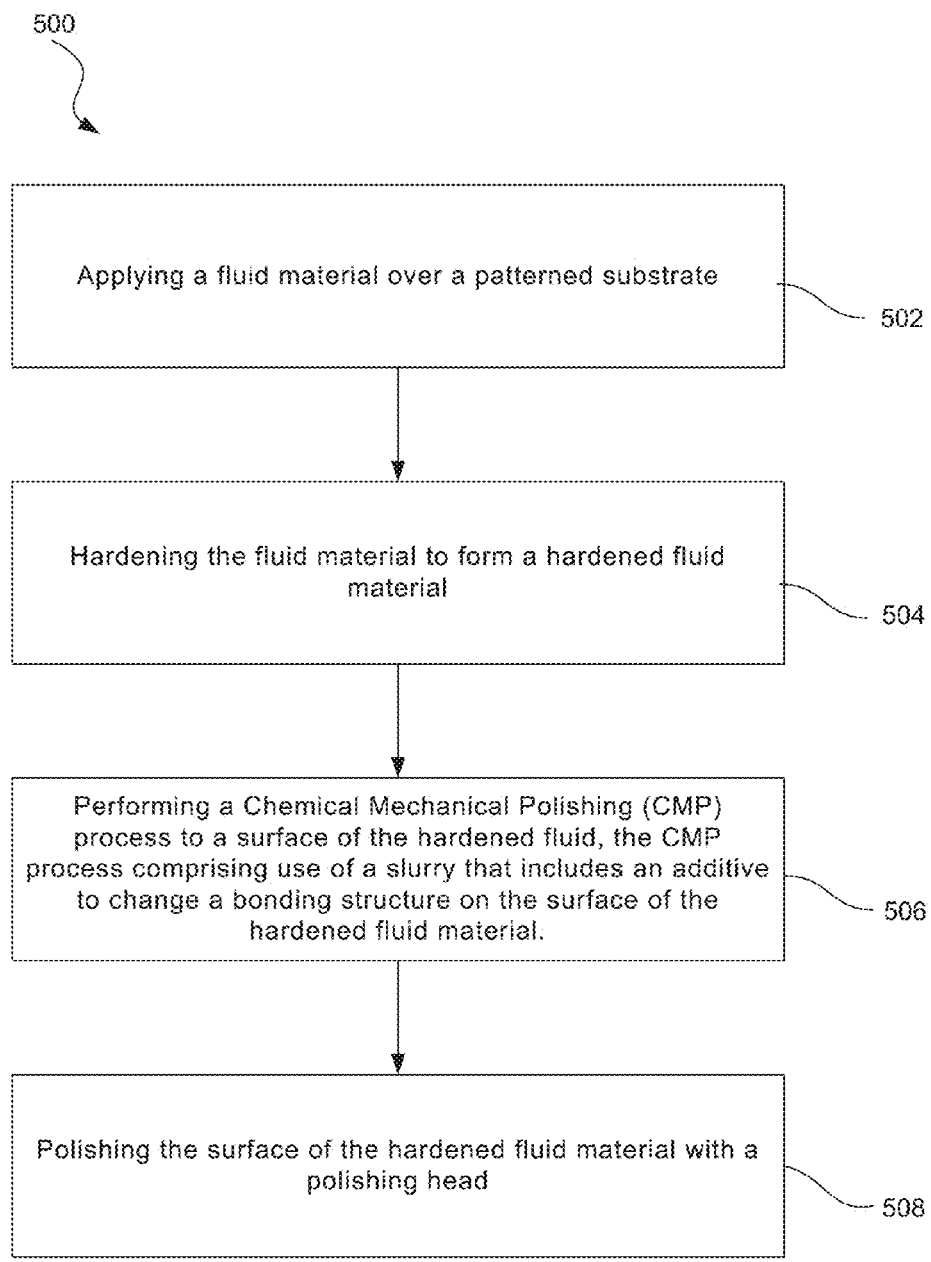
FIG. 5 is a flowchart showing an illustrative method for using a CMP process on a hardened fluid material.

FIG. 5 is a flowchart showing an illustrative method for using a CMP process on a hardened fluid material. According to the present example, the method 500 includes a step 502 for applying a fluid material over a patterned substrate. As described above, the fluid material may be a photoresist material or an anti-reflective coating material. A photoresist material may not have a photosensitive component such as a PAG because it is not being used for photolithographic purposes.

The fluid material may be any other type of material that is capable of being applied as a fluid and hardened into a solid material. For example, the fluid material may be one that can be applied using a spin coating process. As described above, the spin coating process involves application of a small amount of fluid at the center of the wafer. The wafer is then rotated at a relatively high speed to cause the fluid to evenly cover the surface of the wafer. Additionally, the fluid material may be one that can harden through a process such as a baking process. Such baking processes may be used in conventional processes after a photoresist layer has been exposed to a light source through a mask to form a pattern. But, for purposes described herein, the photoresist is not necessarily being used for patterning and thus the baking process may be performed immediately after the spin coating process is complete.

According to the present example, the method 500 includes a step 504 for hardening the fluid material to form a hardened material. The hardening step may be done through a baking process. The hardening step may also involve cross linking. Because of the uneven nature of features on the patterned substrate, the top surface of the hardened fluid will not be very flat. Thus, it is desirable to planarize the surface using a CMP process.

According to the present example, the method 500 includes a step 506 for performing a Chemical Mechanical Polishing (CMP) process to a surface of the hardened fluid, the CMP process comprising use of a slurry solution that includes an additive to change a bonding structure on the surface of the hardened fluid material. Specifically, the additive may break the carbon-carbon bonds or carbon-oxygen bonds of the hardened fluid material.

The additive may include a stripper additive that includes a stripper additive that includes a material such as N-methyl-2-pyrrolidone (NMP), dimethyl sulfoxide (DMSO), sulfolane, or dimethylformamide (DMF). The additive may also include an oxidizer such as hydrogen peroxide ($H_2O_2$), ammonium persulfate (($NH_4$)$_2S_2O_8$), peroxymonosulfuric acid ($H_2SO_5$), ozone ($O_3$) in de-ionized water, and sulfuric acid ($H_2SO_4$). The additive may also include non-spherical abrasives. In some examples, the pH level of the slurry solution is kept below 7. The slurry solution may include other components such as a wetting agent or surfactant.

According to certain illustrative examples, the method 500 further includes a step 508 for polishing the surface of the hardened fluid material with a polishing head. The polishing head may secure the semiconductor wafer thereto using a vacuum process. The polishing head may then press the wafer up to a polishing pad on which the slurry solution has been applied by a slurry delivery tool. The polishing head may then move the wafer with respect to the polishing pad to perform the CMP process.

After the CMP process, which has been designed for effective planarization of a hardened fluid, is performed, subsequent processes may be performed to complete the layer. For example, various etching processes may be applied to remove or reduce the height of various features. The hardened fluid material may act as a protectant for the substrate during such etching processes. After the etching processes have been performed, and the hardened fluid material is no longer needed, then the hardened fluid material may be removed through various methods. One such method of removing the hardened fluid material is a plasma ashing process.

According to one embodiment, a method for performing a Chemical Mechanical Polishing (CMP) process includes applying a CMP slurry solution to a surface of a hardened fluid material on a substrate, the solution comprising an additive to change a bonding structure on the surface of the hardened fluid material. The method further includes polishing the surface of the hardened fluid material with a polishing head.

According to one embodiment, a method includes applying a fluid material over a patterned substrate, hardening the fluid material to form a hardened fluid material, performing a Chemical Mechanical Polishing (CMP) process to a surface of the hardened fluid, the CMP process comprising use of a slurry solution that includes an additive, to change a bonding structure on the surface of the hardened fluid material.

According to one embodiment, a slurry solution for a Chemical Mechanical Polishing (CMP) process includes an organic solvent, a wetting agent, a stripper additive that comprises at least one of: N-Methyl-2-pyrrolidone (NMP), Dimethyl Sulfoxide (DMSO), Sulfolate, or dimethylformamide (DMF), and an oxidizer additive comprising hydrogen peroxide ($H_2O_2$) and sulfuric acid ($H_2SO_4$).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for performing a Chemical Mechanical Polishing (CMP) process, the method comprising:
    applying a CMP slurry solution to a surface of a hardened fluid material on a substrate, the solution comprising an additive selected to change a bonding structure on the surface of the hardened fluid material, wherein the additive includes a stripper additive or an oxidizer additive comprising hydrogen peroxide ($H_2O_2$) and sulfuric acid ($H_2SO_4$), the additive configured to break carbon-oxygen bonds of the hardened fluid material; and
    polishing the surface of the hardened fluid material with a polishing head.

2. The method of claim 1, wherein the additive includes a stripper additive and comprises at least one of: N-methyl- 2-pyrrolidone (NMP), dimethyl sulfoxide (DMSO), sulfolane, and dimethylformamide (DMF).

3. The method of claim 1, wherein the additive includes an oxidizer additive.

4. The method of claim 3, wherein the oxidizer additive comprises at least one of:
hydrogen peroxide ($H_2O_2$), ammonium persulfate (($NH_4)_2$ $S_2O_8$), peroxymonosulfuric acid ($H_2SO_5$), ozone ($O_3$) in de-ionized water, and sulfuric acid ($H_2SO_4$).

5. The method of claim 1, wherein the ratio of hydrogen peroxide and sulfuric acid is within a range of about 1:1 and 1:10.

6. The method of claim 1, the slurry includes both a stripper additive and an oxidizer additive.

7. The method of claim 1, wherein a pH of the slurry solution is less than seven and wherein the slurry solution comprises slurry solution particles that include non-spherical particles.

8. The method of claim 1, wherein the hardened fluid material is a photoresist material.

9. The method of claim 1, further comprising:
after polishing the surface, performing a removal process to substantially equalize heights of a plurality of features formed on the substrate and underneath the hardened fluid material; and
after performing the removal process, removing the hardened fluid material.

10. A method comprising:
applying a fluid material over a patterned substrate;
hardening the fluid material to form a hardened fluid material; and
performing a Chemical Mechanical Polishing (CMP) process to a surface of the hardened fluid, the CMP process comprising use of a slurry solution that includes an additive comprising hydrogen peroxide ($H_2O_2$) and sulfuric acid ($H_2SO_4$) to change a bonding structure on the surface of the hardened fluid material, the additive configured to break carbon-oxygen bonds of the hardened fluid material.

11. The method of claim 10, further comprising, after the CMP process, performing an etching process on features of the patterned substrate.

12. The method of claim 11, further comprising, after the etching process, removing remaining hardened fluid material from the substrate.

13. The method of claim 12, further comprising, forming an interlayer dielectric material over the features of the patterned substrate.

14. The method of claim 10, wherein hardening the fluid material comprises baking the fluid.

15. The method of claim 10, wherein the additive comprises a stripper additive that comprises at least one of: N-methyl-2-pyrrolidone (NMP), dimethyl sulfoxide (DMSO), sulfolane, and dimethylformamide (DMF).

16. The method of claim 10, wherein the additive includes an oxidizer additive comprising at least one of hydrogen peroxide ($H_2O_2$), ammonium persulfate (($NH_4)_2S_2O_8$), peroxymonosulfuric acid ($H_2SO_5$), ozone ($O_3$) in de-ionized water, and sulfuric acid ($H_2SO_4$).

17. A method for performing a Chemical Mechanical Polishing (CMP) process, the method comprising:
providing an additive to a CMP slurry solution; the additive selected to change a bonding structure on a surface of a hardened fluid material, the additive comprising hydrogen peroxide (H2O2) and sulfuric acid (H2SO4) configured to break carbon-oxygen bonds of the hardened fluid material;
applying the CMP slurry solution to the surface of the material; and
polishing the surface of the material with a polishing head and the applied CMP slurry solution.

18. The method of claim 17, wherein the additive includes a stripper additive and comprises at least one of: N-methyl-2-pyrrolidone (NMP), dimethyl sulfoxide (DMSO), sulfolane, and dimethylformamide (DMF).

19. The method of claim 17, wherein the additive includes an oxidizer additive.

\* \* \* \* \*